US011271335B2

(12) United States Patent
Haswarey et al.

(10) Patent No.: US 11,271,335 B2
(45) Date of Patent: Mar. 8, 2022

(54) ALL-INCLUSIVE CPU CARRIER THAT ENABLE AUTOMATION AND TOOL FREE OPERATION AT LOW-COST WHILE IMPROVING THERMAL PERFORMANCE

(71) Applicant: Intel Corporation, Santa Clara, CA (US)

(72) Inventors: Mustafa H. Haswarey, Tigard, OR (US); Ming-Chen Chang, Portland, OR (US); Divya Swamy Bandaru, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 744 days.

(21) Appl. No.: 16/017,026

(22) Filed: Jun. 25, 2018

(65) Prior Publication Data

US 2019/0393631 A1  Dec. 26, 2019

(51) Int. Cl.
| | |
|---|---|
| H05K 7/14 | (2006.01) |
| H05K 7/18 | (2006.01) |
| H01R 12/70 | (2011.01) |
| G06F 1/20 | (2006.01) |

(52) U.S. Cl.
CPC .......... *H01R 12/7023* (2013.01); *G06F 1/20* (2013.01); *H01R 12/7047* (2013.01); *H05K 7/1431* (2013.01)

(58) Field of Classification Search
USPC ...................................................... 361/802
See application file for complete search history.

(56) References Cited

U.S. PATENT DOCUMENTS

| | | | | |
|---|---|---|---|---|
| 4,402,399 A | * | 9/1983 | Friess ...................... | A47G 1/12 206/0.83 |
| 5,713,744 A | * | 2/1998 | Laub .................... | H05K 7/1061 439/71 |
| 7,697,296 B2 | * | 4/2010 | Floyd .................... | H01L 23/467 361/719 |
| 2010/0297857 A1 | * | 11/2010 | Ito ........................ | H01R 12/523 439/65 |
| 2012/0257366 A1 | * | 10/2012 | Mason ............... | H01R 13/2414 361/807 |
| 2016/0195684 A1 | * | 7/2016 | De Bruijn .............. | G02B 6/428 385/92 |
| 2020/0328135 A1 | * | 10/2020 | Harvey Terhune, IV ................... | H01L 23/4006 |

* cited by examiner

*Primary Examiner* — Hung S. Bui
(74) *Attorney, Agent, or Firm* — Schwabe, Williamson & Wyatt, P.C.

(57) ABSTRACT

Embodiments include a carrier assembly, a method of forming the carrier assembly, and a semiconductor package. A carrier assembly includes a socket on a package substrate, and a carrier having a transparent material, a first opening, first alignment openings, and barbs. The carrier assembly also includes an electronic device embedded into the first opening of carrier and coupled to the carrier by barbs. The carrier assembly further includes a bolster plate on the package substrate, the bolster plate having a second opening, loading studs, and second alignment openings, and the second opening surrounds the socket. Each loading stud is positioned on a corner edge of the bolster plate. The carrier assembly may align the first alignment openings above the second alignment openings to couple the carrier onto the bolster plate. The carrier assembly may include a heat sink disposed on the electronic device, carrier, and bolster plate.

23 Claims, 8 Drawing Sheets

405 — DISPOSES AN ELECTRONIC DEVICE INTO A FIRST OPENING OF A CARRIER, WHEREIN THE ELECTRONIC DEVICE IS EMBEDDED INTO A FIRST OPENING OF THE CARRIER, AND WHEREIN THE ELECTRONIC DEVICE IS COUPLED TO THE CARRIER BY BARBS OF THE CARRIER.

410 — DISPOSES THE CARRIER ONTO A BOLSTER PLATE AND A SOCKET THAT ARE DISPOSED ON A PACKAGE SUBSTRATE, WHEREIN FIRST ALIGNMENT OPENINGS OF THE CARRIER AND SECOND ALIGNMENT OPENINGS OF THE BOLSTER PLATE ARE COUPLED BY SCREWS.

415 — DISPOSES A HEAT SINK ON THE ELECTRONIC DEVICE, THE CARRIER, AND THE BOLSTER PLATE, WHEREIN THE HEAT SINK IS COUPLED TO THE BOLSTER PLATE BY COUPLING LOADS NUTS OF THE HEAT SINK ONTO LOADING STUDS OF THE BOLSTER PLATE.

FIG. 4

ALL-INCLUSIVE CPU CARRIER THAT ENABLE AUTOMATION AND TOOL FREE OPERATION AT LOW-COST WHILE IMPROVING THERMAL PERFORMANCE

FIELD

Embodiments relate to packaging semiconductor devices. More particularly, the embodiments relate to an all-inclusive central process unit (CPU) carrier and methods for forming such CPU carrier.

BACKGROUND

Packaging of semiconductor devices present several problems. One of the main problems involves designing a central processing unit (CPU) carrier that is used with socket loading mechanisms. Existing CPU carriers typically require anti-tilt mechanisms, dependently attached heat sinks, and thermal interface material (TIM) breaker mechanisms. In addition, some of the disadvantages of these CPU carriers include a sequenced assembly with no visibility of the CPU and the CPU socket, an increase of the overall number of assembly components, and a process flow that is unable to be automated which increases assembly cost and operation time.

Previous CPU retention/loading mechanisms required a package carrier that had to be attached to a heat sink assembly along with a CPU and TIM. The package carrier functioned as a protection barrier that protects the CPU against accidental damage. This typically required a processor heat sink loading module (PHLM) which included attaching the package carrier onto the heat sink and then coupling a processor (or CPU) with a TIM onto the attached package carrier and heat sink assembly. A major problem with the PHLM assembly is the need of an additional TIM bond breaker tool that had to be included as part of the PHLM assembly to enable breaking the TIM bond between the heat sink and the processor—without damaging the processor.

In addition to the package carrier of the PHLM, a bolster plate assembly was required to have an anti-tilt mechanism that protected the socket from pin damage due to excessive tilting of the processor as the socket was being loaded. One of the problems of needing anti-tilt mechanisms is adding surface space for the anti-tilt mechanisms at the expense of reducing the heat sink area which compromises the thermal performance of the CPU carrier. Furthermore, once the PHLM assembly and the bolster plate assembly are stacked, the stacked assemblies provide no visibility of the socket below as the assemblies are lowered and loaded onto the socket.

Another problem with the existing CPU carriers is requiring this sequenced assembly to be implemented by operators—rather than by automation—to prevent the CPU from tilting and damaging the socket. This problem, therefore, increases the assembly time and cost.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

FIG. 2A is a bottom-perspective, exploded view of the process flow to form the carrier assembly including the electronic device disposed and embedded in the carrier, according to one embodiment.

FIG. 4 is a process flow illustrating a method of forming a carrier assembly including a heat sink, an electronic device, a carrier, a bolster plate, and a package substrate having a socket and a back plate, according to one embodiment.

DETAILED DESCRIPTION

Described herein is an all-inclusive central process unit (CPU) carrier and methods for forming such CPU carrier. In particular, a carrier assembly is described below and a method of forming such carrier assembly may include an electronic device (e.g., a CPU), a transparent carrier (i.e., the carrier comprising (or formed with) a transparent material), and a bolster plate disposed on a package substrate (e.g., a printed circuit board (PCB)), where the bolster plate also surrounds a socket (e.g., a PCB socket) disposed on the package substrate. For some embodiments, the carrier assembly may include embedding the electronic device into the carrier, and stacking the carrier onto the bolster plate as the embedded electronic device is coupled onto the socket on the package substrate. Accordingly, as described in further detail below, these embodiments create a cost-effective, automated and thermal beneficial all-inclusive carrier assembly which advantageously eliminates needing an anti-tilt mechanism, a thermal interface material (TIM) breaking tool, and an assembly sequence.

Figure 1:
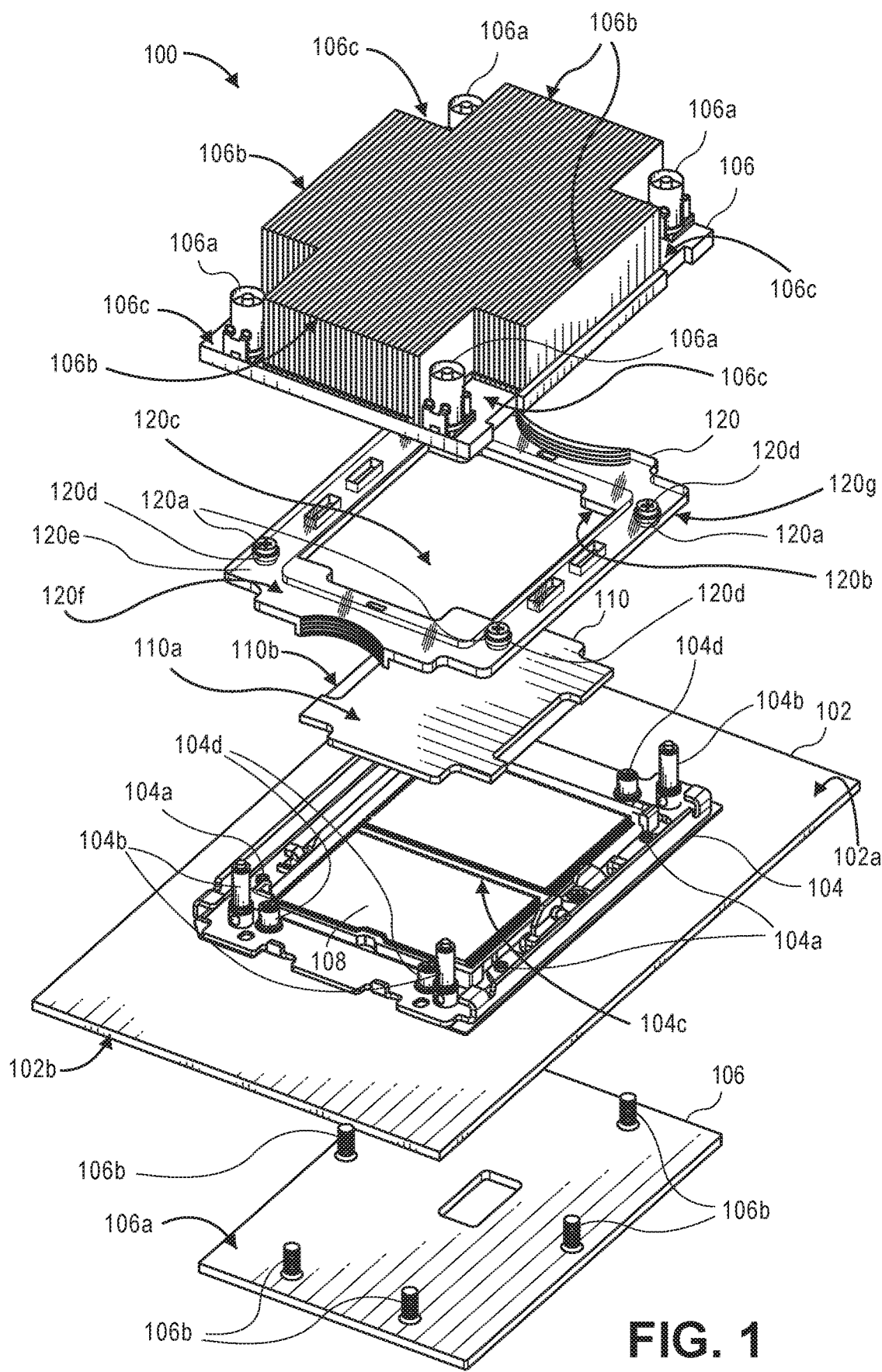
FIG. 1 is a cross-sectional, exploded view of a carrier assembly including a heat sink, an electronic device, a carrier, a bolster plate, and a package substrate having a socket and a back plate, according to one embodiment.

According to some embodiments, a carrier assembly is described (e.g., the carrier assembly 100 shown in FIG. 1). For one embodiment, the carrier assembly includes a socket disposed on a top surface of a package substrate. In one embodiment, the carrier assembly also includes a carrier (e.g., the carrier 120 of FIG. 1) having a transparent material (i.e., the transparent material on each surface of the carrier is transparent to an electromagnetic radiation in a visible spectrum), a first opening, first alignment openings, and barbs. According to one embodiment, the carrier assembly further includes an electronic device (e.g., a CPU, a microprocessor, a semiconductor die, etc.) embedded into the first opening of the carrier, where the electronic device is coupled to the carrier by the barbs of the carrier. Additionally, in one embodiment, the carrier assembly includes a bolster plate (e.g., the bolster plate 104 of FIG. 1) disposed on the top surface of the package substrate, and the bolster plate having a second opening, loading studs, and second alignment openings. For one embodiment, the bolster plate having each of the loading studs positioned on a corner edge, and the second opening surround the socket on the package substrate. In one embodiment, the carrier assembly includes disposing and aligning the first alignment openings of the carrier above the second alignment openings of the bolster plate to couple the carrier onto the bolster plate on the package substrate—without needing a heat sink to couple the carrier onto the bolster plate.

Figure 2A:
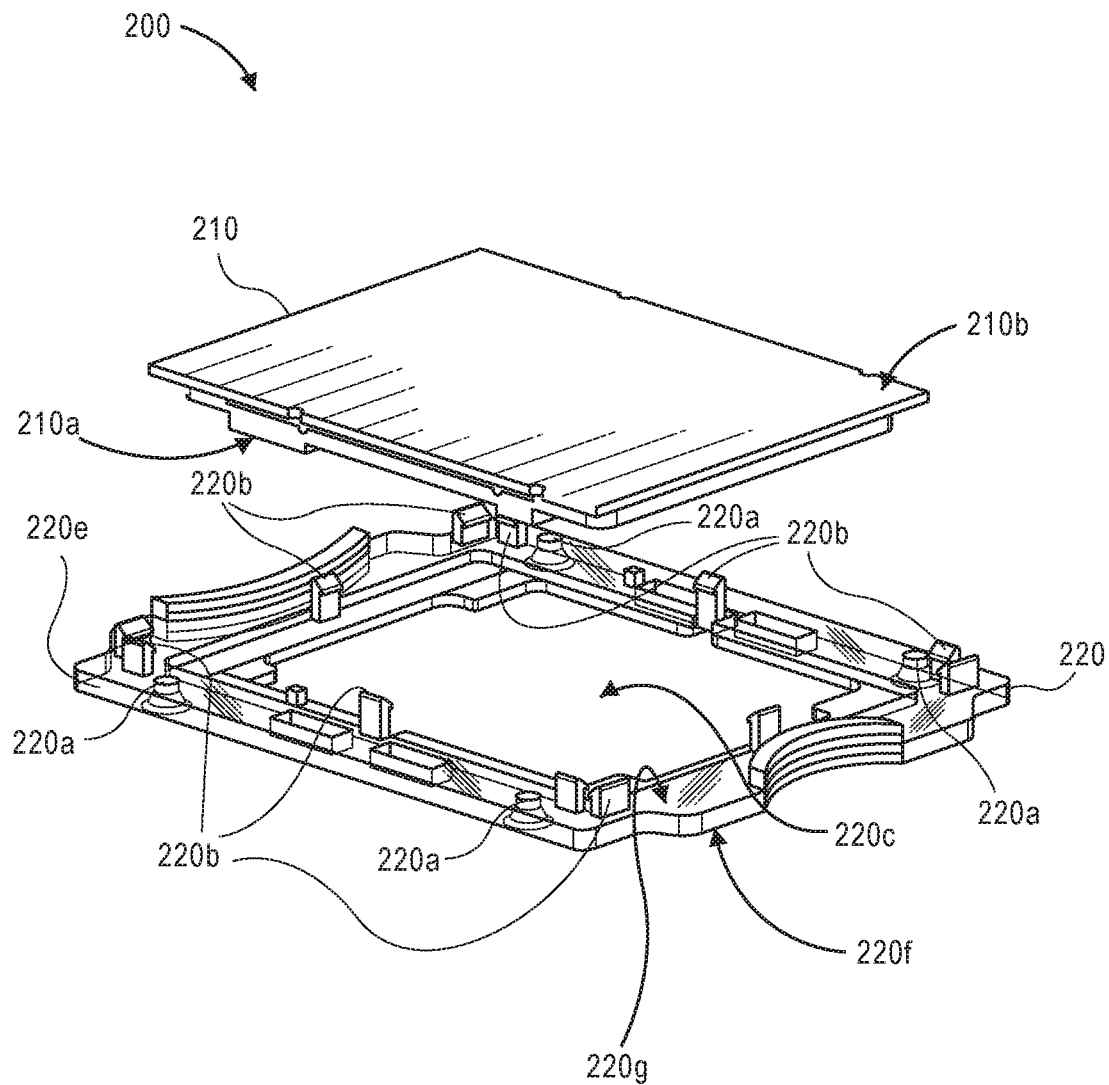
FIGS. 2A-2C are perspective, exploded view of a process flow to form a carrier assembly including a heat sink, an electronic device, a carrier, a bolster plate, and a package substrate having a socket and a back plate, according to some embodiments.
Figure 2B:
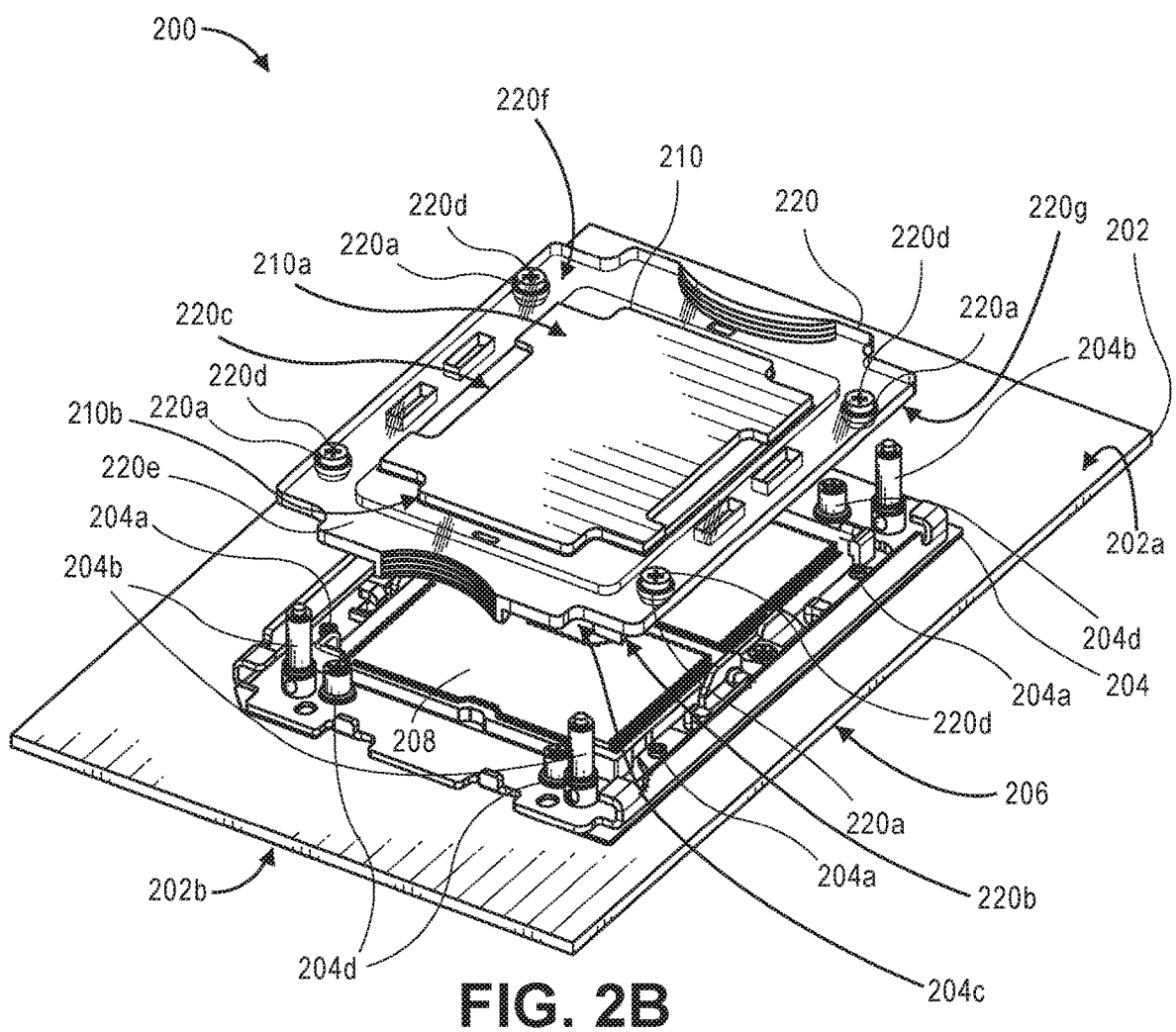
Figure 2C:
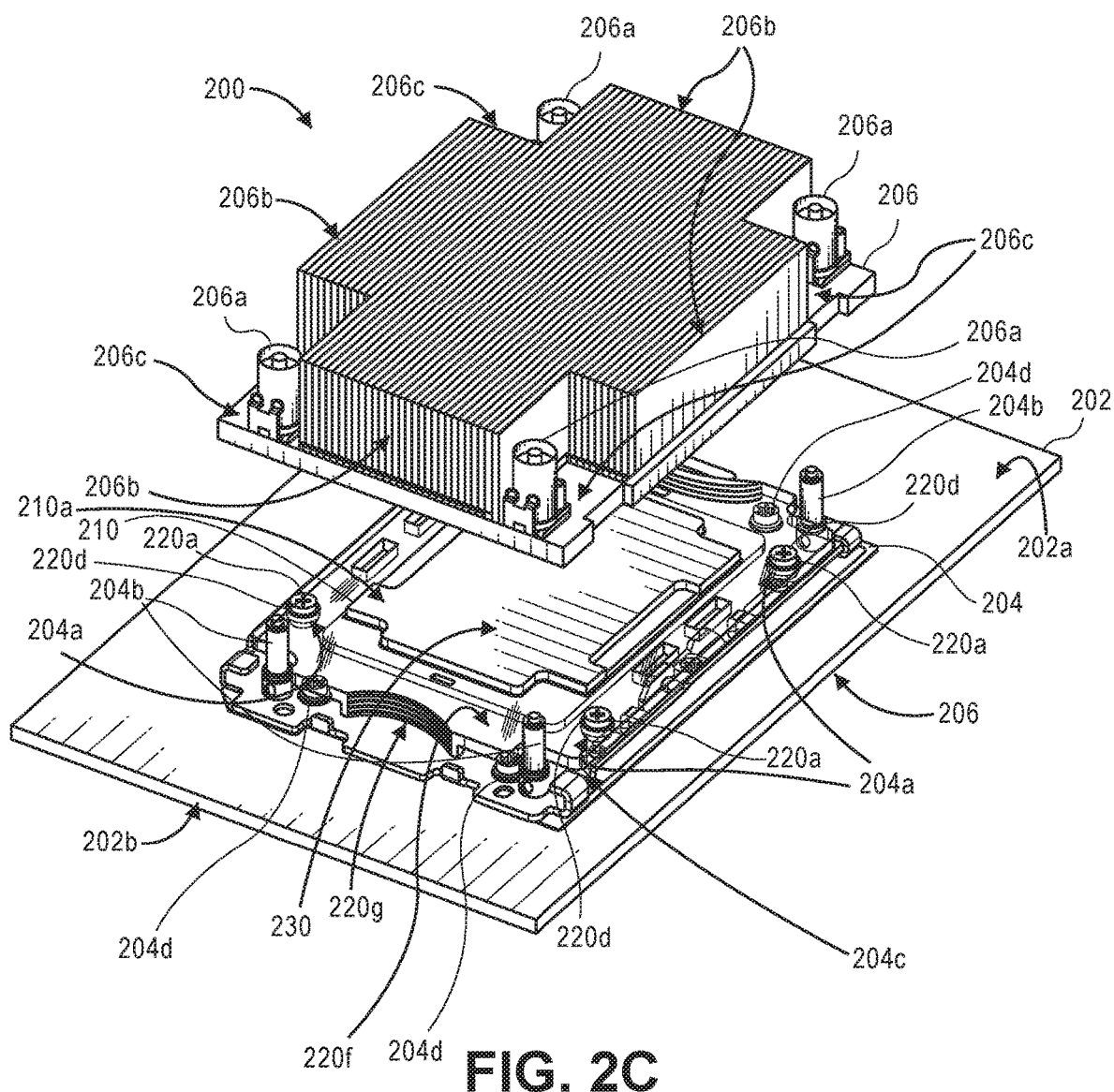

For some additional embodiments, the carrier assembly may include a heat sink (e.g., the heat sink 206 as shown in FIG. 2C) disposed (or stacked) on the die, the carrier, and the bolster plate. In these additional embodiments, the heat sink having each load nut positioned on a corner edge, and the loads nuts disposed and coupled onto the loading studs of the bolster plate. According to additional embodiments, the carrier assembly may also include a thermal interface material (TIM) (e.g., the TIM layer 230 as shown in FIG. 2C) disposed between a bottom surface of the heat sink and a top surface of the electronic device.

Accordingly, as described herein, the embodiments of the carrier assembly (which may also be referred to as the CPU carrier assembly, the electronic device carrier assembly, the CPU carrier system, and/or the CPU carrier package) advantageously enable a CPU carrier to be completely independent of a heat sink as the CPU carrier may be directly coupled to a bolster plate using screws (or any other securing mechanisms). These embodiments are a major improvement to the existing socket loading assemblies/mechanisms which require (i) a CPU carrier to be initially assembled to a heat sink, and (ii) the assembled CPU carrier and heat sink to only then be coupled to a bolster plate.

These embodiments also help to eliminate needing an additional anti-tilt mechanism used in existing solutions to prevent socket damage. For example, in these existing solutions, the loading sequence of an assembled heat sink and CPU cause tilting and damage the socket as the assembled heat sink and CPU are loaded onto the socket. In these embodiments, since the electronic device and carrier are assembled and coupled to the bolster plate independently of the heat sink, the loading sequence of the heat sink does not impact (or cause tilting of) the electronic device which is previously loaded on the socket and held down by the bolster plate. Likewise, as an anti-tilt mechanism is not required, these embodiments do not require anti-tilt nuts on the top surface of the heat sink, which (i) advantageously enables an increase to the footprint of the heat sink to add additional heat sink fin areas (or heat pipes) by reducing the number of fin cutouts (e.g., from 6 cutouts to 4 cutouts), and (ii) therefore improves the thermal performance.

Figure 2D:
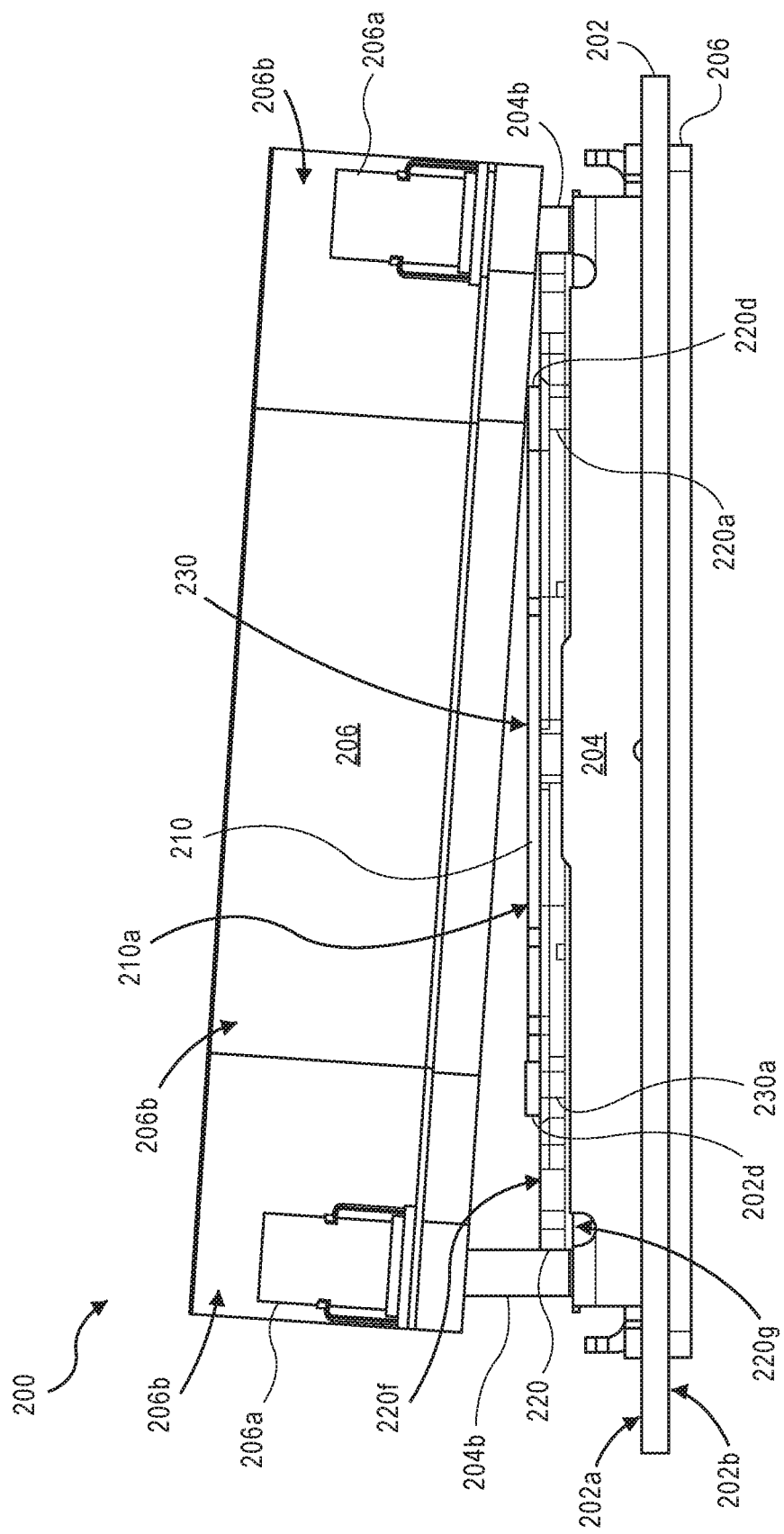
FIG. 2D is a cross-sectional, exploded view of the respective process flow to form the carrier assembly, according to one embodiment.

Additionally, these embodiments help to further eliminate needing a TIM breaker tool also used in existing solutions to break the TIM bond disposed between the CPU and the heat sink when replacing the CPU. In these embodiments, the carrier assembly does not require a TIM breaker tool as the TIM bond disposed between the electronic device and the heat sink may automatically be broken when unloading the heat sink from the bolster plate (e.g., as shown in FIG. 2D when unloading the heat sink 206). For example, the carrier assembly may hold down the electronic device to the bolster plate which facilitates breaking the TIM bond naturally as the heat sink is removed/unloaded from above the electronic device.

Other advantages and improvements of the embodiments described herein include: (i) eliminating a sequenced assembly of attaching/screwing/tightening the anti-tilt nuts on the heat sink first followed by the load nuts on the heat sink (as was previously needed by existing solutions when loading the heat sink and CPU onto the socket); (ii) enabling an automated process flow to dispose the carrier (and the embedded electronic device) onto the bolster plate with a suction machine (or the like) and tighten the carrier to the bolster plate with a robotic arm (i.e., eliminating a factory operator to assemble the CPU carrier assembly by hand); (iii) providing a transparent carrier to allow enhanced visibility (or human visibility) of the socket from above (or through) the transparent surfaces of the carrier, which may facilitate loading and aligning the carrier onto the socket and the bolster plate (as existing solutions include assembling the heat sink on the carrier and CPU initially in which the heat sink thus hinders any visibility when being loaded onto the socket); and (iv) reducing the assembly time with the automated process flow, and the assembly costs of the carrier assembly with the reduced assembly time and the eliminated anti-tilt mechanism and TIM breaker tools.

The technologies described herein may be implemented in one or more electronic devices. For example, an electronic device may include a microelectronic device, a semiconductor die, an integrated circuit (IC), a central processing unit (CPU), a microprocessor, a platform controller hub (PCH), a memory, and a field-programmable gate array (FPGA). Moreover, non-limiting examples of electronic devices that may utilize the technologies described herein may include any kind of wireless device, mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any semiconductor packaged system having socket loading mechanisms that need an all-inclusive carrier assembly.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

FIG. 1 is a cross-sectional, exploded view of a carrier assembly 100 including an electronic device 110, a carrier 120, a bolster plate 104, and a package substrate 102. For one embodiment, the carrier assembly 100 may include a heat sink 106, a socket 108, and a back plate 106, where both the socket 108 and the back plate 106 may be disposed on the package substrate 102.

As described herein, a "carrier assembly" (also referred to as an all-inclusive carrier assembly) refers to the assembly of a heat sink, an electronic device, a carrier, a bolster plate, a socket, a back plate, and a package substrate. For example, the carrier assembly may refer to combining one or more smaller assemblies, including (i) the assembly of the electronic device into the carrier (e.g., as shown in FIG. 2A), (ii) the assembly of the bolster plate, the socket, and the back plate onto the package substrate (e.g., as shown in FIG. 2B), and (iii) the assembly of the electronic device and carrier onto the bolster plate and socket on the package substrate (e.g., as shown in FIG. 2B). Additionally, as described above, the carrier assembly may then refer to an independent assembly of a heat sink and a TIM onto the previously assembled electronic device, carrier, bolster plate, socket, back plate, and package substrate (e.g., as shown in FIG. 2C). Also described herein, an "electronic device carrier" refers to the coupled/assembled electronic device and carrier (i.e., when the electronic device is disposed and embedded in an opening of the carrier).

Referring back to FIG. 1, the carrier assembly 100 illustrates the bolster plate 104 and the socket 108 disposed on a top surface 102a of the package substrate 102. In one embodiment, the bolster plate 104 has an opening 104c that surrounds the socket 108 on the package substrate 102. For one embodiment, the socket 108 may be any appropriate socket for receiving/loading the electronic device 110, including a CPU socket, a PCB socket, and metalized particle interconnect (MPI) sockets (generally used with chipset and application specific integrated circuit (ASIC) applications). It is understood that the carrier assembly 100 may be used with any single or multi-device socket, such as a multi-chip processor (MCP) socket.

For one embodiment, a bottom surface 102b of the package substrate 102 may be coupled to a top surface 106a of the back plate 106. In some embodiments, the back plate 106 may include mounting bolts 106b (or any other securing/mounting mechanism) on the top surface 106. For one embodiment, the back plate 106 may be used to secure (or tighten) the bolster plate 104 onto the package substrate 102. For example, the mounting bolts 106b of the back plate 106 may align with mounting nuts 104d on the bolster plate 104 and one or more holes in the package substrate 102. Continuing with the above example, the mounting bolts 106b are then disposed/inserted into the aligned holes of the package substrate 102 to securely couple the bolster plate 104 and the back plate 106 onto the package substrate 102 by coupling (or securing/tightening) the mounting nuts 104d of the bolster plate 104 with the mounting bolts 106b of the back plate 106.

According to some embodiments, the package substrate 102 may include, but is not limited to, a substrate, a PCB, and a motherboard. For one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 102 (e.g., the holes drilled in the PCB 102 to secure and couple the bolster plate 104 and the back plate 106). Note that the holes may be obstructed by the bolster plate 104. For one embodiment, the PCB 102 may also include the socket 108, conductive copper traces, and metallic vias/pads.

In one embodiment, the bolster plate 104 further includes openings 104a (or alignment openings) and loading studs 104b. For some embodiments, the openings 104a are disposed on the bolster plate 104 to couple (or secure/affix) the carrier 120 onto the bolster plate 104. Additionally, in some embodiments, the loading studs 104b are disposed on the bolster plate 104 to couple the heat sink 106 onto the bolster plate 104. Each of the loading studs 104b may be positioned on a corner edge of the bolster plate 104. As described below, the carrier 120 has openings 120a that are aligned/disposed above the openings 104a of the bolster plate 104, where screws 120d (or any other securing mechanism) are inserted into the aligned openings 120a and 104a to couple the carrier 120 onto the bolster plate 140.

For some embodiments, as described above, the carrier 120 may be a transparent carrier. In these embodiments, the transparent carrier 120 may be formed of a transparent material 120e (e.g., a clear plastic case/enclosure) which may be transparent to an electromagnetic radiation in a visible spectrum. For one embodiment, the transparent material 120e may refer to a completely transparent, translucent, clear, crystal clear, see-through, glassy, etc., and the visible spectrum may refer to wavelengths from approximately 390 nm to 700 nm (i.e., violet to red in the color spectrum). In one embodiment, each of the components and surfaces of the carrier 120 are formed (or molded) with the transparent material 120e to provide see-through visibility through the carrier 120. For example, the carrier 120 enables user visibility of the socket 108 while the carrier 120 is disposed and lowered on the socket 108, and thus the carrier 120 eliminates any blind assembly problems (or visibility obstructions as the socket 108 is loaded).

In some embodiments, the carrier 120 includes the transparent material 120e, a first opening 120c, the openings 120a, barbs 120b (or retaining mechanisms), and screws 120d (or any other securing mechanisms). According to some embodiments, the carrier has a top surface 120f and a bottom surface 120g that is opposite to the top surface 120f. The first opening 120c of the carrier 120 may have a footprint that is approximately equal to a footprint of a top surface 110a of the electronic device 110. For one embodiment, the carrier 120 may have a footprint that is approximately equal to or greater than the footprint of the electronic device 110. For one embodiment, the footprint of the carrier 120 may be approximately equal to or lower than a footprint of the bolster plate 104. For example, the footprint of the carrier 120 may be approximately 150 mm$^2$ or less. In some embodiments, the carrier 120 may have a thickness (a z-height) that is approximately equal to or less than a thickness of the electronic device 110. For example, the carrier 120 may have a thickness of approximately 50 nm or less. Note that the size (e.g., thickness, footprint/area) of the carrier 120 and the size of the opening 120c of the carrier 120 may be based on a desired size of the electronic device 110.

For some embodiments, the electronic device 210 has the top surface 210a and a bottom surface 210b that is opposite to the top surface 210a. For one embodiment, as shown in FIG. 1, the top surface 110a of the electronic device 110 is co-planar to the bottom surface 120g of the carrier 120. In this embodiment, the top surface 110a of the electronic device 110 may be disposed (or inserted) into the first opening 120c of the carrier 120. In one embodiment, the electronic device 110 may be coupled/attached to the carrier 110 and embedded in the first opening 120c of the carrier 120, where the electronic device 110 is coupled (or attached/ secured) to the carrier 120 with the barbs 120b. Note, that as shown in FIG. 1, the barbs 120b are disposed on the bottom surface 120g of the carrier 120 and may not be easily illustrated in this top-perspective view (e.g., compared to illustrated view of the barbs 220b in FIG. 2A).

In one embodiment, the barbs 120b may be disposed on the bottom surface 120g of the carrier 120, the barbs 120b may surround the first opening 120c of the carrier 120, and the barbs 120b may be positioned on the periphery edges of the opening 120c of the carrier 120. In one embodiment, when the electronic device 110 is disposed into the first opening 120c of the carrier 120, the barbs 120b may couple onto (or snap-in/latch) the bottom surface 110b of the electronic device 110 to embed the electronic device 110 in the first opening 120c of the carrier 120. Note that, at this instance, the carrier 120 and the embedded electronic device 110 may be referred to as an electronic device carrier.

For some embodiments, the electronic device 110 includes, but is not limited to, a semiconductor die, an IC, a CPU, a microprocessor, a PCH, a memory, and a FPGA. In one embodiment, the electronic device 110 is a CPU. For one embodiment, the electronic device 110 may be disposed/ embedded into the opening 120c of the carrier 120 to assemble the electronic device carrier which is then disposed and secured onto the bolster plate 104 and the socket 108—without previously attaching a heat sink on/above the electronic device carrier (e.g., as shown in FIG. 2B).

Additionally, note that since the electronic device 110 is secured (or held down) by the screws 120d that are inserted into the openings 120a of the carrier 120 and the openings 104a of the bolster plate 104, the electronic device 110 does not tilt as the heat sink 106 is disposed on the electronic device 110 and the load nuts 106a of the heat sink 106 are tightened/secured onto the loading studs 104b of the bolster plate 104. As such, the carrier assembly 100 does not require any anti-tilt nuts/mechanisms as the loading of the heat sink 106 is independent of the loading of the electronic device 110 and carrier 120, and the carrier assembly 100 thereby reduces damage to the socket 108.

In some embodiments, the heat sink 106 includes load nuts 106a, fins 106b (or heat sink fins), and fin cutouts 106c. For one embodiment, each loads nut 106a is disposed in a fin cutout 106a of the heat sink 106, where each fin cutout 106a is formed (or located) at a corner edge of the heat sink 106. For one embodiment, the loads nuts 106a of the heat sink 106 are used to couple and secure the heat sink 106 onto the load studs 104b of the bolster plate 104.

In one embodiment, since anti-tilt nuts/mechanisms are not needed on the top surface of the heat sink 106, the heat sink 106 may only need four fin cutouts 106c—rather than 6 fin cutouts typically required to accommodate the 2 anti-tilt nuts—and thus have additional footprint to gain additional fin area for the fins 106b, which significantly improves the thermal performance of the carrier assembly 100. For example, the thermal performance difference ($\Delta \text{Psi}_{ca}$) of the carrier assembly 100 may improve approximately 60% or greater than the existing CPU carrier assemblies needing anti-tilt mechanisms. Note that, in alternate embodiments, the heat sink 106 may include four or less fin cuts based on the desired thermal requirements and packaging design. For example, the heat sink 106 may need no fin cuts for load nuts and, in this instance, the bolster plate 104 may be implemented (or designed/formed) with additional securing mechanisms (e.g., barbs or snap-in mechanisms) to couple the heat sink 106 onto the bolster plate 104.

For some embodiments, after the electronic device carrier is coupled on the socket 108 and bolster plate 104, the heat sink 106 may then be disposed on/above the electronic device 110, the carrier 120, and the bolster plate 104. In one embodiment, the load nuts 106a of the heat sink 106 are aligned and disposed on the load studs 104b of the bolster plate 104 to secure (or tighten) the load nuts 106a of the heat sink 106 onto the load studs 104b of the bolster plate 104 (e.g., as shown in FIG. 2C). The carrier assembly 100 may use the heat sink 106 to dissipate heat away from the electronic device 110. In one embodiment, the heat sink 106 may be any type of passive heat exchanger that can transfer and dissipate the heat generated by the electronic device 110. For some embodiments, the heat sink 106 may include a high thermally conductive material, such as aluminum alloys, copper, aluminum, other thermally conductive metals, or any combination thereof. In one embodiment, the heat sink 106 may have a footprint that is approximately equal to the footprint of the bolster plate 104. For example, in one embodiment, the footprints of the heat sink 106 and the bolster plate 104 may be approximately 150 mm$^2$ or less.

According to other embodiments, a TIM (e.g., the TIM 230 of FIG. 2C) may be disposed between a bottom surface of the heat sink 106 and the top surface 110a of the electronic device 110. Note that the TIM layer may be disposed on the top surface 110a of the electronic device 110 at any stage/step of the process flow that is used to create the carrier assembly 100. For example, the TIM can be disposed on the electronic device 110 prior to (or after) embedding the electronic device 110 into the carrier 120, or after the electronic device 110 is loaded and coupled to the socket 108.

The TIM may be used to facilitate thermal conduction from the electronic device 110 to the heat sink 106, an ambient environment, or any other heat exchanger. The TIM may include at least one of a high thermal conductivity adhesive material or a metallic alloy. For example, the TIM may include at least one of a metal based TIM, a polymer matrix TIM, thermal grease, or any other TIM material layer.

Note that the carrier assembly 100 may include fewer or additional packaging components based on the desired packaging design.

FIGS. 2A-2C are perspective, exploded view of a process flow to form a carrier assembly 200 including an electronic device 210, a carrier 220, a bolster plate 204, a package substrate 202, a heat sink 206, a socket 208, and a back plate 206. FIG. 2A is a bottom-perspective, exploded view of the process flow to form the carrier assembly 200 including the electronic device 210 disposed and embedded in the carrier 220, according to one embodiment. FIG. 2D is a cross-sectional, exploded view of the respective process flow to form the carrier assembly 200, according to one embodiment. These embodiments as shown with respect to FIGS. 2A-2D provide the process flow that combines (i) an electronic device and a carrier assembly, (ii) a bolster plate, a socket, a back plate, and a package substrate assembly, and (iii) a heat sink and a TIM assembly, where each assembly are combined to create the carrier assembly 200 (e.g., the carrier assembly 200 as shown in FIGS. 2C-2D). For one embodiment, the carrier assembly 200 shown in FIGS. 2A-2D may be similar to the carrier assembly 100 of FIG. 1.

One such embodiment is illustrated and described based on FIGS. 2A-2D, which illustrates perspective and cross-sectional views, respectively, of the carrier assembly 200. In the illustrated embodiments, the assembly of the process flow of the carrier assembly 200 is shown, however it is to be appreciated that the illustrated features are not limiting and may be formed using different processing operations. Note that well-known features of FIGS. 2A-2D are omitted or simplified in order not to obscure the illustrative implementations.

Referring now to FIG. 2A, the carrier assembly 200 illustrates an electronic device 210 and a carrier 220 from a bottom-to-top view (i.e., the illustrated top surface 210b is the bottom surface 210b of the electronic device 210). For one embodiment, the carrier assembly 200 disposes (or attaches) the electronic device 210 into a first opening 220c of the carrier 220, according to one embodiment. The carrier assembly 200 illustrates the electronic device 210 and the carrier 220 which are similar to the electronic device 110 and the carrier 120 as described above in FIG. 1. For one embodiment, the carrier 220 may include a transparent material 220e, the first opening 220c, first alignment openings 220a (or openings), and barbs 220b. According to some embodiments, the carrier has a top surface 220f and a bottom surface 220g that is opposite to the top surface 220f. In one embodiment, each of the components and surfaces of the carrier 220 are formed (or molded) with the transparent material 220e to provide see-through visibility through the carrier 220.

According to some embodiments, the electronic device 210 has a top surface 210a and a bottom surface 210b that is opposite to the top surface 210a. For one embodiment, as shown in FIG. 2A, the top surface 210a of the electronic device 210 is co-planar to the bottom surface 220g of the carrier 220 as the top surface 210a of the electronic device 210 is disposed (or inserted) into the first opening 220c of the carrier 220. In one embodiment, the electronic device 210 is coupled/attached to the carrier 210 and embedded in the first opening 220c of the carrier 220, where the electronic device 210 is coupled (or attached/secured) to the carrier 220 with the barbs 220b. As shown in FIG. 2A, the barbs 220b are disposed on the bottom surface 220g of the carrier 220, and the barbs 220b are surrounding the first opening 220c of the carrier 220. In one embodiment, when the electronic device 210 is disposed into the first opening 220c of the carrier 220, the barbs 220b may latch onto (or snap-in) the bottom surface 210b of the electronic device 210 to embed the electronic device 210 in the first opening 220c of the carrier 220. Note that, at this instance, the carrier 220 and the embedded electronic device 210 may be referred to as an electronic device carrier.

FIG. 2B illustrates the carrier assembly 200 disposing the carrier 220 and the electronic device 210 (i.e., the electronic device carrier) onto a bolster plate 204 and a socket 208 which are both disposed on a top surface 202a of a package substrate 202, according to one embodiment. The carrier assembly 200 illustrates the bolster plate 204, the socket 208, the back plate 206, and the package substrate 202 which are similar to the bolster plate 204, the socket 208, the back plate 206, and the package substrate 202 as described above in FIG. 1.

For one embodiment, the package substrate 202 may include the socket 208 disposed on the top surface 202a of the package substrate 202. In one embodiment, the package substrate 202 may also include the bolster plate 204 disposed on the top surface 202a of the package substrate 202. The bolster plate 204 may include a second opening 204c, loading studs 204b, and second alignment openings 204a (or openings). For one embodiment, the second opening 204c of the bolster plate 204 surrounds the socket 208 on the package substrate 202. In another embodiment, the package substrate 202 may further include the back plate 206 disposed on a bottom surface 202b of the package substrate 202, where the back plate 206 may be coupled to mounting bolts 204 on the bolster plate 204 to provide additional reinforcement for the package substrate 202.

Additionally, in some embodiments, the carrier assembly 200 may dispose and align the first alignment openings 220a of the carrier 220 above the second alignment openings 204a of the bolster plate 204, and thus dispose and align the bottom surface 210b of the electronic device 210 above the socket 208. For example, the carrier assembly 200 may implement a suction machine (or the like) to dispose the electronic device carrier 210 and 220 from a tray (or the like) onto the bolster plate 204 and the socket 208 on the package substrate 202. In these embodiments, the bottom surface 220g of the carrier 220 and the bottom surface 210b of the electronic device 210 are above the bolster plate 204 and the socket 208, respectively, as the electronic device carrier 210 and 220 are disposed onto the bolster plate 204 and the socket 208.

For these embodiments, after the electronic device carrier 210 and 220 is disposed and aligned onto the bolster plate 204, the carrier assembly 200 may then couple (or secure/tighten) the electronic device 210 and the carrier 220 respectively onto the socket 208 and the bolster plate 204 using screws 220d (or any other securing mechanism). Continuing with the above example, after the suction cup disposes the electronic device carrier 210 and 200 onto the socket 208 and the bolster plate 204, the carrier assembly 200 may implement a robotic arm (or the like) to assemble/dispose/insert the screws 220d into the first alignment openings 220a of the electronic device carrier 210 and 220 and into the second alignment openings 204a of the bolster plate 204. For this example, the carrier assembly 200 may then implement the robotic arm to couple/secure the electronic device carrier 210 and 220 onto the bolster plate 204 by screwing/tightening the screws 220d.

Note that, based on the desired packaging design, the screws 220d may be inserted into the first alignment openings 220a of the carrier 220 (i) prior to disposing the carrier 220 onto the bolster plate 204 (as shown in FIG. 2B) or (ii) after disposing and aligning the carrier 220 onto the bolster plate 204.

FIG. 2C illustrates the carrier assembly 200 disposing a heat sink 206 on/above the top surface 210a of the electronic device 210, the top surface 220f of the carrier 220, and the bolster plate 220, according to one embodiment. The carrier assembly 200 illustrates the heat sink 206 which is similar to the heat sink 106 as described above in FIG. 1. The heat sink 206 may include load nuts 206a, fins 206b, and fin cutouts 206c. In one embodiment, as shown in FIG. 2C, the heat sink 206 includes four fin cutouts 206c and four fins 206b, where each fin 206b is disposed between at least two of the four fin cutouts 206c. Each load nut 260a may be disposed in a fin cutout 206c of the heat sink 206. Each fin cutout 206c may be located at a corner edge of the heat sink 206.

In one embodiment, the carrier assembly 200 may couple the heat sink 206 onto the bolster plate 204 by coupling/tightening the loads nuts 206a of the heat sink 206 onto the loading studs 204b of the bolster plate 204. For one embodiment, the carrier assembly may dispose a TIM 230 on the top surface 210a of the electronic device 210, where the TIM 230 may then be stacked/sandwiched between the bottom surface of the heat sink 206 and the top surface 210a of the electronic device 210. Note that, after the heat sink 206 is secured onto the bolster plate 204, the carrier assembly 200 is then entirely assembled.

FIG. 2D illustrates the carrier assembly 200 removing (or replacing) the electronic device 210, and breaking the TIM 230 bond between the heat sink 206 and the top surface 210a of the electronic device 210—without needing a TIM breaking tool (e.g., a flat-heat screw driver). In some embodiments, the electronic device 210 may be removed by (i) uncoupling the load nuts 206a of the heat sink 206 and (ii) then removing the heat sink 206 from above the top surface 210a of the electronic device 210 and the top surface 220f of the carrier 220 as the electronic device 210 and carrier 220 are coupled to (or held down by) the bolster plate 204—which thereby breaks the TIM 230 bond between the bottom surface of the heat sink 206 and the top surface 210a of the electronic device 210.

Note that the carrier assembly 200 formed by the process flow of FIGS. 2A-2D may include fewer or additional packaging components based on the desired packaging design.

Figure 3:
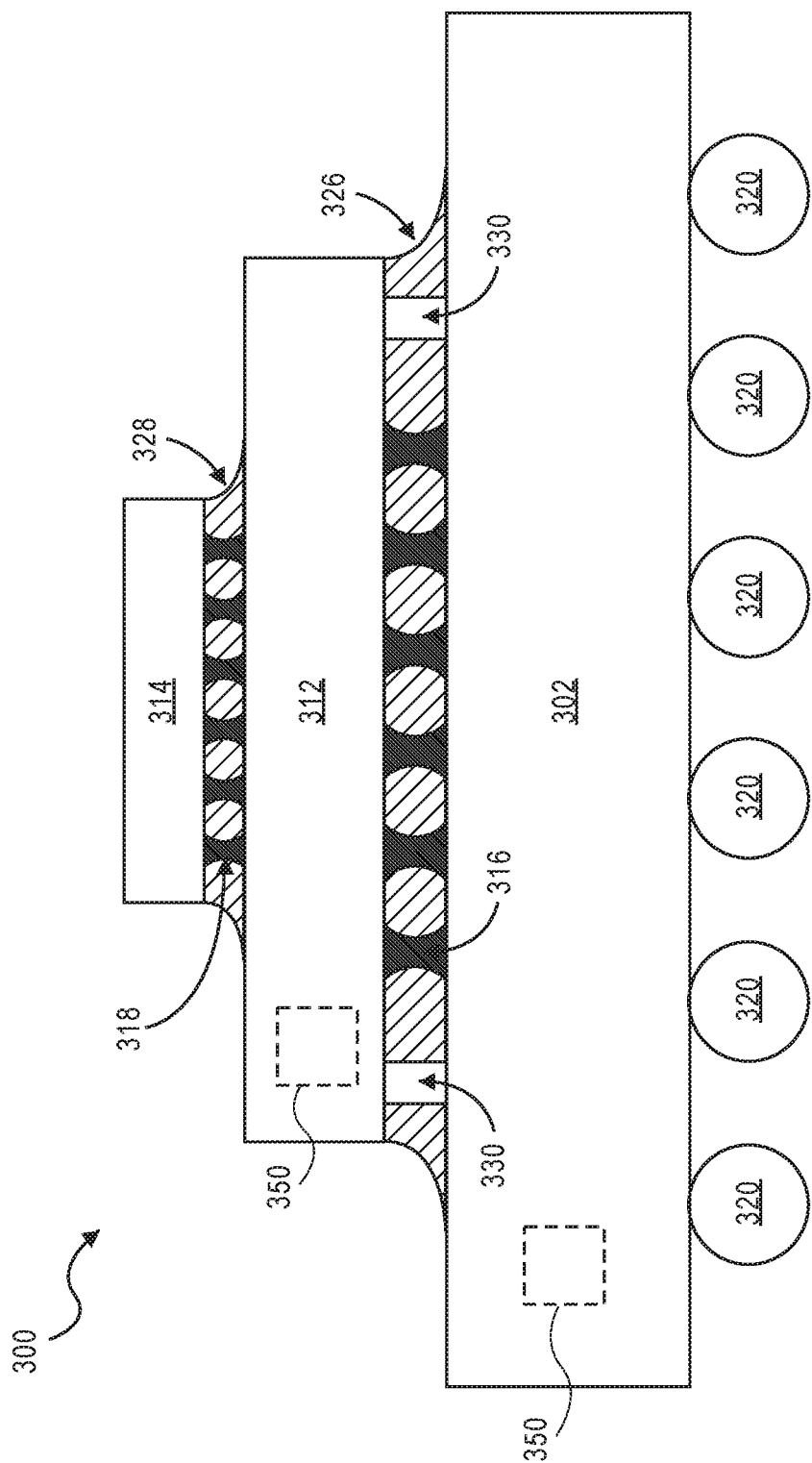
FIG. 3 is a cross-sectional view of a semiconductor packaged system including a die, a substrate, a package substrate, and one or more carrier assemblies, according to one embodiment.

FIG. 3 illustrates a semiconductor package 300 including a die 314, a substrate 312 (or an interposer), interconnect structures (e.g., the plurality of bumps disposed below the die 314 and the substrate 312), and a package substrate 302, where the substrate 312 and/or the package substrate 302 may include one or more carrier assemblies 350 as described herein. For some embodiments, the carrier assemblies 350 may include a heat sink, a TIM, an electronic device, a carrier, a socket, a back plate, and a package substrate (e.g., the substrate 312 or the package substrate 302). For one embodiment, the one or more carrier assemblies 350 may be similar to the carrier assembly 100 of FIG. 1 and the carrier assembly 200 of FIGS. 2A-2D. Note that the semiconductor package 300 is not limited to the illustrated semiconductor packaged system, and thus may be designed/formed with fewer, alternate, or additional packaging components and/or with different interconnecting structures.

For one embodiment, the package substrate 302 (or the substrate 312) of the semiconductor package 300 may include a carrier assembly having a socket disposed on a top surface of the package substrate 302, where the top surface is opposite to a bottom surface of the package substrate 302. The carrier assembly may include an electronic device that is embedded into a first opening of the carrier, where the electronic device is coupled (or secured) to the carrier by the barbs of the carrier. The carrier may include a transparent material, first alignment openings, and barbs. The carrier assembly may also include a bolster plate on the top surface of the package substrate 302, where the bolster plate may have a second opening, loading studs, and second alignment openings. The carrier assembly may further comprise a heat sink disposed on the electronic device, the carrier, and the bolster plate. The heat sink may include load nuts that are each positioned on a corner edge of the heat sink, and the loads nuts may be coupled onto the loading studs of the bolster plate. The carrier assembly may also comprises a TIM disposed between a bottom surface of the heat sink and a top surface of the electronic device, and a back plate disposed on the bottom surface of the package substrate 302 as the back plate is coupled to the bolster plate.

According to one embodiment, the semiconductor package 300 is merely one example of an embodiment of a semiconductor packaged system. For one embodiment, the semiconductor package 300 may include a land grid array (LGA) package and/or a pin grid array (PGA) package. For one embodiment, a die 314 (or an integrated circuit die) is coupled to a substrate 312 (e.g., an interposer) via one or more bumps/joints formed from respective microbumps. As described above, a solder joint formed by soldering of a microbump according to an embodiment may itself be referred to as a "bump" and/or a "microbump." Additionally, for other embodiments, the die 314, the substrate 312, and the package substrate 302 may be coupled using anisotropic conductive film (ACF). For one embodiment, the substrate 312 may be, but is not limited to, a silicon interposer and/or a die with through silicon vias (TSVs). For an alternate embodiment, the semiconductor package 300 may omit the interposer/substrate 312.

For some embodiments, the semiconductor package 300 may have the die 314 disposed on the interposer 312, where both the stacked die 314 and interposer 312 are disposed on a package substrate 302. According to some embodiments, the package substrate 302 may include, but is not limited to, a package, a substrate, a PCB, and a motherboard. For one embodiment, the package substrate 302 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where each dielectric layer can be a photosensitive dielectric layer. For some embodiments, holes may be drilled in the PCB 302. For one embodiment, the PCB 302 may also include conductive layers that comprise copper lines/traces, metallic pads, vias, via pads, planes, and/or holes.

For one embodiment, the die 314 may include, but is not limited to, a semiconductor die, an electronic device (e.g., a wireless device), an IC, a CPU, a microprocessor, a PCH, a memory, and a FPGA. The die 314 may be formed from a material such as silicon and have circuitry thereon that is to be coupled to the interposer 312. Although some embodiments are not limited in this regard, the package substrate 302 may in turn be coupled to another body, for example, a computer motherboard. One or more connections between the package substrate 302, the interposer 312, and the die 314—e.g., including some or all of bumps 316, 318, and 320—may include one or more interconnect structures and underfill layers 326 and 328. In some embodiments, these interconnect structures (or connections) may variously comprise an alloy of nickel, palladium, and tin (and, in some embodiments, Cu).

Connections between the package substrate 302 and another body may be made using any suitable structure, such as the illustrative bumps 320 shown. The package substrate 302 may include a variety of electronic structures formed thereon or therein. The interposer 312 may also include electronic structures formed thereon or therein, which may be used to couple the die 314 to the package substrate 302. For one embodiment, one or more different materials may be used for forming the package substrate 302 and the interposer 312. In certain embodiments, the package substrate 302 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the semiconductor package 300 may include gap control structures 330—e.g., positioned between the package substrate 302 and the interposer 312. Such gap control structures 330 may mitigate a change in the height of the gap between the package substrate 302 and the interposer 312, which otherwise might occur during reflowing while die 314 is attached to interposer 312. Note that the semiconductor package 300 includes an underfill material 328 between the interposer 312 and the die 314, and an underflow material 326 between the package substrate 302 and the interposer 312. For one embodiment, the underfill materials (or layers) 326 and 328 may be one or more polymers that are injected between the layers. For other embodiments, the underfill materials may be molded underfills (MUF).

Note that the semiconductor packaged system 300 may include fewer or additional packaging components based on the desired packaging design.

FIG. 4 is a process flow 400 illustrating a method of forming a carrier assembly including a heat sink, a die, a carrier, and a package substrate having a socket and a back plate, according to one embodiment. For one embodiment, the process flow 400 includes one or more steps used to form a carrier assembly as described herein (e.g., the carrier assembly 100 of FIG. 1 and the carrier assembly 200 of FIGS. 2A-2D). According to one embodiment, the process flow 400 may be similar to the process flow illustrated with FIGS. 2A-2D. Specifically, in some embodiments, the process flow 400 may be used to create an all-inclusive carrier assembly (e.g., the carrier assembly 200 of FIG. 2D) that is low-cost, automated, thermally beneficial, and eliminates the need for anti-tilt mechanisms, TIM breaking tools, and blind and assembly sequences.

At block 405, the process flow 400 disposes an electronic device into a first opening of a carrier, where the electronic device is embedded into the first opening of the carrier, and the electronic device is coupled to the carrier by barbs of the carrier (e.g., as shown in FIGS. 2A-2B). The carrier may include a transparent material and first alignment openings.

At block 410, the process flow 400 disposes the carrier and the electronic device (i.e., the electronic device carrier) on a bolster plate and a socket which are disposed on a package substrate (e.g., as shown in FIG. 2B). For example, the process flow 400 may use (or program) a suction machine (or the like) to place the electronic device carrier from a tray (or the like) onto the bolster plate and the socket on the package substrate. The bolster plate may include a second opening, second alignment openings, and loading studs, where each of the loading studs is positioned on a corner edge. The second opening of the bolster plate may surround the socket on the package substrate.

Additionally, at block 410, the process flow 400 aligns the first alignment openings of the carrier above of the second alignment openings of the bolster plate to couple (or secure/tighten) the electronic device carrier onto the socket and the bolster plate using screws (or any other securing mechanism) (e.g., as shown in FIGS. 2B-2C). Continuing with the above example, after the suction cup disposes the electronic device carrier onto the bolster plate and socket, the process flow 400 may use a robotic arm (or the like) to assemble/dispose/insert the screws into the first alignment openings of the electronic device carrier and then couple/secure the electronic device carrier onto the bolster plate. Note that, based on the desired packaging design, the screws may be inserted into the first alignment openings of the carrier (i) prior to disposing the carrier onto the bolster plate (e.g., as shown in FIG. 2B) or (ii) after disposing and aligning the carrier onto the bolster plate.

At block 415, the process flow 400 disposes a heat sink on/above the electronic device, the carrier, and the bolster plate, where the heat sink includes load nuts, fins, and fin cutouts, where each load nut is disposed in a fin cutout, and where each fin cutout is located at a corner edge of the heat sink (e.g., as shown in FIG. 2C). Additionally, at block 415, the process flow 400 couples (or secures) the heat sink is coupled to the bolster plate by coupling the loads nuts of the heat sink onto the loading studs of the bolster plate (e.g., as shown in FIG. 2D). For one embodiment, the process flow may dispose a TIM on the top surface of the electronic device, where the TIM is disposed (or sandwiched) between the bottom surface of the heat sink and the top surface of the electronic device (e.g., as shown in FIG. 2C). In another embodiment, the process flow may dispose a back plate on the bottom surface of the package substrate, where the back plate is coupled to the bolster plate to provide additional reinforcement for the package substrate.

For other embodiments, as shown in FIG. 2D, the process flow may remove (or replace) the electronic device by uncoupling the load nuts of the heat sink and removing the heat sink from above the electronic device that is coupled to (or held down by) the bolster plate, which thereby breaks the TIM bond between the heat sink and the electronic device (i.e., eliminating the need of a TIM breaker tool/mechanism).

Note that the carrier assembly formed by process flow 400 may include fewer or additional packaging components based on the desired packaging design.

Figure 5:
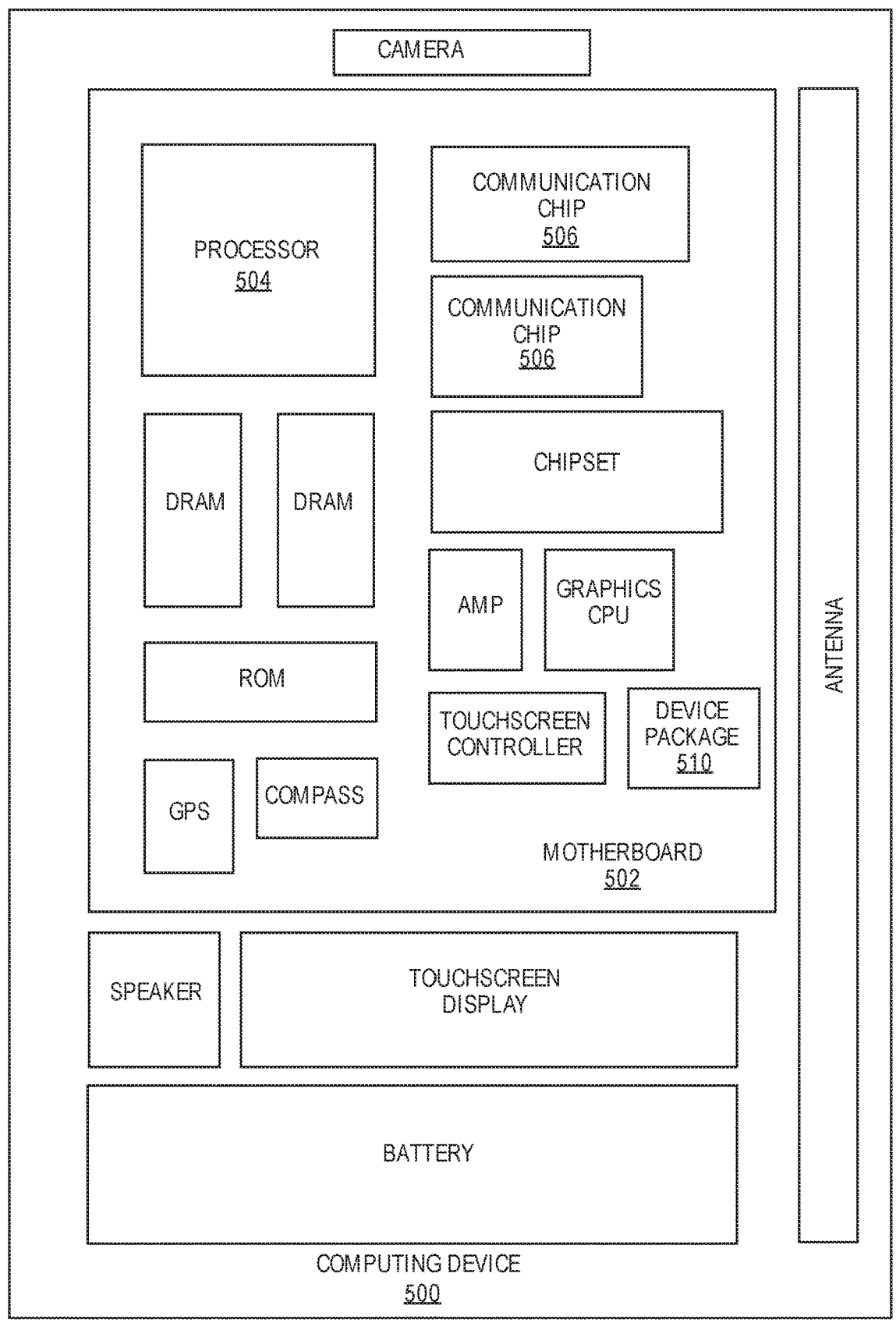
FIG. 5 is a schematic block diagram illustrating a computer system that utilizes a carrier assembly including a heat sink, an electronic device, a carrier, a bolster plate, and a package substrate having a socket and a back plate, according to one embodiment.

FIG. 5 is a schematic block diagram illustrating a computer system 500 that utilizes a carrier assembly including a heat sink, an electronic device, a carrier, a bolster plate, and a package substrate having a socket and a back plate, according to one embodiment. FIG. 5 illustrates an example of computing device 500. Computing device 500 houses motherboard 502. For one embodiment, motherboard 502 may be similar to the package substrates 102, 202, and 302 of FIGS. 1-3. Motherboard 502 may include a number of components, including but not limited to processor 504, device package 510 (or semiconductor package), and at least one communication chip 506. Processor 504 is physically and electrically coupled to motherboard 502. For some embodiments, at least one communication chip 506 is also physically and electrically coupled to motherboard 502. For other embodiments, at least one communication chip 506 is part of processor 504.

Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 506 enables wireless communications for the transfer of data to and from computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

Processor 504 of computing device 500 includes an integrated circuit die packaged within processor 504. Device package 510 may be, but is not limited to, a substrate, a package substrate, and/or a PCB. Device package 510 may include a carrier assembly (as illustrated in FIGS. 1-2) having a heat sink, an electronic device, a carrier, a bolster plate, and a package substrate having a socket and a back plate—or any other components from the figures described herein. Further, as described herein, the device package 510 may include a carrier assembly (i.e., an all-inclusive carrier assembly) that is cost-effective, automated, and thermally beneficial, additionally the carrier assembly also advantageously eliminates needing an anti-tilt mechanism, a TIM breaking tool, a blind assembly, and an assembly sequence.

Note that device package 510 may be a single component/device, a subset of components, and/or an entire system, as the materials, features, and components may be limited to device package 510 and/or any other component of the computing device 500 that may need an all-inclusive carrier assembly (and/or an electronic device carrier) as described herein (e.g., the motherboard 502, the processor 504, and/or any other component of the computing device 500 that may need the carrier assembly and/or the electronic device carrier for socket loading mechanisms).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 506 also includes an integrated circuit die packaged within the communication chip 506. For some embodiments, the integrated circuit die of the communication chip may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a carrier assembly, comprising a socket on a top surface of a package substrate. The top surface is opposite to a bottom surface of the package substrate; a carrier having a transparent material, a first opening, first alignment openings, and barbs; an electronic device embedded into the first opening of the carrier. The electronic device is coupled to the carrier by the barbs of the carrier; and a bolster plate on the top surface of the package substrate, the bolster plate having a second opening, loading studs, and second alignment openings. Each of the loading studs is positioned on a corner edge of the bolster plate. The second opening of the bolster plate surrounds the socket on the package substrate. The first alignment openings of the carrier are aligned above the second alignment openings of the bolster plate to couple the carrier onto the bolster plate.

In example 2, the subject matter of example 1 can optionally include the carrier assembly of claim 1, further comprising: a heat sink on the electronic device, the carrier, and the bolster plate. The heat sink includes load nuts, fins, and fin cutouts. Each load nut is disposed in a fin cutout of the heat sink. Each fin cutout is located at a corner edge of the heat sink. The heat sink is coupled to the bolster plate by coupling the loads nuts of the heat sink onto the loading studs of the bolster plate; a thermal interface material (TIM) on a top surface of the electronic device. The TIM is between a bottom surface of the heat sink and the top surface of the electronic device; and a back plate on the bottom surface of the package substrate. The back plate is coupled to the bolster plate.

In example 3, the subject matter of any of examples 1-2 can optionally include the first alignment openings of the carrier and the second alignment openings of the bolster plate are coupled by screws.

In example 4, the subject matter of any of examples 1-3 can optionally include the transparent material of the carrier is transparent to an electromagnetic radiation in a visible spectrum.

In example 5, the subject matter of any of examples 1-4 can optionally include the electronic device which includes a semiconductor die, an integrated circuit (IC), a central processing unit (CPU), a microprocessor, a platform controller hub (PCH), a memory, and a field-programmable gate array (FPGA).

In example 6, the subject matter of any of examples 1-5 can optionally include the carrier having a thickness that is approximately equal to or less than a thickness of the electronic device.

In example 7, the subject matter of any of examples 1-6 can optionally include the heat sink which includes four fin cutouts and four fins. Each fin is disposed between two of the four fin cutouts.

In example 8, the subject matter of any of examples 1-7 can optionally include the electronic device and the carrier coupled onto the bolster plate without the heat sink.

Example 9 is a method of forming a carrier assembly, comprising: disposing an electronic device into a first opening of a carrier, the carrier having a transparent material, first alignment openings, and barbs. The electronic device is embedded into the first opening of the carrier. The electronic device is coupled to the carrier by the barbs of the carrier; disposing a bolster plate and a socket on a top surface of a package substrate. The top surface is opposite to a bottom surface of the package substrate. The bolster plate includes a second opening, second alignment openings, and loading studs. The second opening of the bolster plate surrounds the socket. Each of the loading studs is positioned on a corner edge of the bolster plate; disposing the carrier and the electronic device onto the bolster plate and the socket on the package substrate. The first alignment openings of the carrier are positioned above the second alignment openings of the bolster plate to couple the electronic device onto the socket, and the carrier onto the bolster plate; and disposing a heat sink on the electronic device, the carrier, and the bolster plate. The heat sink includes load nuts, fins, and fin cutouts. Each load nut is disposed in a fin cutout of the heat sink. Each fin cutout is located at a corner edge of the heat sink. The heat sink is coupled to the bolster plate by coupling the loads nuts of the heat sink onto the loading studs of the bolster plate.

In example 10, the subject matter of example 9 can optionally include disposing a TIM on a top surface of the electronic device. The TIM is between a bottom surface of the heat sink and the top surface of the electronic device; and disposing a back plate on the bottom surface of the package substrate. The back plate is coupled to the bolster plate.

In example 11, the subject matter of any of examples 9-10 can optionally include the first alignment openings of the carrier and the second alignment openings of the bolster plate are coupled by screws.

In example 12, the subject matter of any of examples 9-11 can optionally include the transparent material of the carrier is transparent to an electromagnetic radiation in a visible spectrum.

In example 13, the subject matter of any of examples 9-12 can optionally include the electronic device which includes a semiconductor die, an IC, a CPU, a microprocessor, a PCH, a memory, and a FPGA.

In example 14, the subject matter of any of examples 9-13 can optionally include the carrier having a thickness that is approximately equal to or less than a thickness of the electronic device.

In example 15, the subject matter of any of examples 9-14 can optionally include the heat sink which includes four fin cutouts and four fins, wherein each fin is disposed between two of the four fin cutouts.

In example 16, the subject matter of any of examples 9-15 can optionally include the electronic device and the carrier coupled onto the bolster plate without the heat sink.

Example 17 is a semiconductor package, comprising: an interposer on a package substrate; and a die on the interposer; and a carrier assembly on the package substrate. The carrier assembly includes a socket on a top surface of the package substrate. The top surface is opposite to a bottom surface of the package substrate; a carrier having a transparent material, a first opening, first alignment openings, and barbs; an electronic device embedded into the first opening of the carrier. The electronic device is coupled to the carrier by the barbs of the carrier; and a bolster plate on the top surface of the package substrate, the bolster plate having a second opening, loading studs, and second alignment openings. Each of the loading studs is positioned on a corner edge of the bolster plate. The second opening of the bolster plate surrounds the socket on the package substrate. The first alignment openings of the carrier are aligned above the second alignment openings of the bolster plate to couple the carrier onto the bolster plate.

In example 18, the subject matter of example 17 can optionally include a heat sink on the electronic device, the carrier, and the bolster plate on the package substrate. The heat sink includes load nuts, fins, and fin cutouts. Each load nut is disposed in a fin cutout of the heat sink. Each fin cutout is located at a corner edge of the heat sink. The heat sink is coupled to the bolster plate by coupling the loads nuts of the heat sink onto the loading studs of the bolster plate; a TIM on a top surface of the electronic device. The TIM is between a bottom surface of the heat sink and the top surface of the electronic device; and a back plate on the bottom surface of the package substrate. The back plate is coupled to the bolster plate.

In example 19, the subject matter of any of examples 17-18 can optionally include the first alignment openings of the carrier and the second alignment openings of the bolster plate are coupled by screws.

In example 20, the subject matter of any of examples 17-19 can optionally include the transparent material of the carrier is transparent to an electromagnetic radiation in a visible spectrum.

In example 21, the subject matter of any of examples 17-20 can optionally include the electronic device which includes a semiconductor die, an IC, a CPU, a microprocessor, a PCH, a memory, and a FPGA.

In example 22, the subject matter of any of examples 17-21 can optionally include the carrier having a thickness that is approximately equal to or less than a thickness of the electronic device.

In example 23, the subject matter of any of examples 17-22 can optionally include the heat sink which includes four fin cutouts and four fins. Each fin is disposed between two of the four fin cutouts.

In example 24 the subject matter of any of examples 17-23 can optionally include the electronic device and the carrier coupled onto the bolster plate without the heat sink.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A carrier assembly, comprising:
    a socket on a top surface of a package substrate, wherein the top surface is opposite to a bottom surface of the package substrate;
    a carrier having a transparent material, a first opening, first alignment openings, and barbs, wherein the transparent material of the carrier is transparent to an electromagnetic radiation in a visible spectrum;
    an electronic device embedded into the first opening of the carrier, wherein the electronic device is coupled to the carrier by the barbs of the carrier; and
    a bolster plate on the top surface of the package substrate, the bolster plate having a second opening, loading studs, and second alignment openings, wherein each of the loading studs is positioned on a corner edge of the bolster plate, wherein the second opening of the bolster plate surrounds the socket on the package substrate, and wherein the first alignment openings of the carrier are aligned above the second alignment openings of the bolster plate to couple the carrier onto the bolster plate.

2. The carrier assembly of claim 1, further comprising:
a heat sink on the electronic device, the carrier, and the bolster plate, wherein the heat sink includes load nuts, fins, and fin cutouts, wherein each load nut is disposed in a fin cutout of the heat sink, wherein each fin cutout is located at a corner edge of the heat sink, and wherein the heat sink is coupled to the bolster plate by coupling the loads nuts of the heat sink onto the loading studs of the bolster plate;
a thermal interface material (TIM) on a top surface of the electronic device, wherein the TIM is between a bottom surface of the heat sink and the top surface of the electronic device; and
a back plate on the bottom surface of the package substrate, wherein the back plate is coupled to the bolster plate.

3. The carrier assembly of claim 2, wherein the heat sink includes four fin cutouts and four fins, wherein each fin is disposed between two of the four fin cutouts.

4. The carrier assembly of claim 2, wherein the electronic device and the carrier are coupled onto the bolster plate without the heat sink.

5. The carrier assembly of claim 1, wherein the first alignment openings of the carrier and the second alignment openings of the bolster plate are coupled by screws.

6. The carrier assembly of claim 1, wherein the electronic device includes a semiconductor die, an integrated circuit (IC), a central processing unit (CPU), a microprocessor, a platform controller hub (PCH), a memory, and a field-programmable gate array (FPGA).

7. The carrier assembly of claim 1, wherein the carrier has a thickness that is approximately equal to or less than a thickness of the electronic device.

8. A method of forming a carrier assembly, comprising:
disposing an electronic device into a first opening of a carrier, the carrier having a transparent material, first alignment openings, and barbs, wherein the electronic device is embedded into the first opening of the carrier, and wherein the electronic device is coupled to the carrier by the barbs of the carrier;
disposing a bolster plate and a socket on a top surface of a package substrate, wherein the top surface is opposite to a bottom surface of the package substrate, wherein the bolster plate includes a second opening, second alignment openings, and loading studs, wherein the second opening of the bolster plate surrounds the socket, and wherein each of the loading studs is positioned on a corner edge of the bolster plate;
disposing the carrier and the electronic device onto the bolster plate and the socket on the package substrate, wherein the first alignment openings of the carrier are positioned above the second alignment openings of the bolster plate to couple the electronic device onto the socket, and the carrier onto the bolster plate; and
disposing a heat sink on the electronic device, the carrier, and the bolster plate, wherein the heat sink includes load nuts, fins, and fin cutouts, wherein each load nut is disposed in a fin cutout of the heat sink, wherein each fin cutout is located at a corner edge of the heat sink, and wherein the heat sink is coupled to the bolster plate by coupling the loads nuts of the heat sink onto the loading studs of the bolster plate.

9. The method of claim 8, further comprising:
disposing a TIM on a top surface of the electronic device, wherein the TIM is between a bottom surface of the heat sink and the top surface of the electronic device; and
disposing a back plate on the bottom surface of the package substrate, wherein the back plate is coupled to the bolster plate.

10. The method of claim 8, wherein the first alignment openings of the carrier and the second alignment openings of the bolster plate are coupled by screws.

11. The method of claim 8, wherein the transparent material of the carrier is transparent to an electromagnetic radiation in a visible spectrum.

12. The method of claim 8, wherein the electronic device includes a semiconductor die, an IC, a CPU, a microprocessor, a PCH, a memory, and a FPGA.

13. The method of claim 8, wherein the carrier has a thickness that is approximately equal to or less than a thickness of the electronic device.

14. The method of claim 8, wherein the heat sink includes four fin cutouts and four fins, wherein each fin is disposed between two of the four fin cutouts.

15. The method of claim 8, wherein the electronic device and the carrier are coupled onto the bolster plate without the heat sink.

16. A semiconductor package, comprising:
an interposer on a package substrate;
a die on the interposer; and
a carrier assembly on the package substrate, wherein the carrier assembly includes
a socket on a top surface of the package substrate, wherein the top surface is opposite to a bottom surface of the package substrate;
a carrier having a transparent material, a first opening, first alignment openings, and barbs, wherein the transparent material of the carrier is transparent to an electromagnetic radiation in a visible spectrum;
an electronic device embedded into the first opening of the carrier, wherein the electronic device is coupled to the carrier by the barbs of the carrier; and
a bolster plate on the top surface of the package substrate, the bolster plate having a second opening, loading studs, and second alignment openings, wherein each of the loading studs is positioned on a corner edge of the bolster plate, wherein the second opening of the bolster plate surrounds the socket on the package substrate, and wherein the first alignment openings of the carrier are aligned above the second alignment openings of the bolster plate to couple the carrier onto the bolster plate.

17. The semiconductor package of claim 16, further comprising:
a heat sink on the electronic device, the carrier, and the bolster plate on the package substrate, wherein the heat sink includes load nuts, fins, and fin cutouts, wherein each load nut is disposed in a fin cutout of the heat sink, wherein each fin cutout is located at a corner edge of the heat sink, and wherein the heat sink is coupled to the bolster plate by coupling the loads nuts of the heat sink onto the loading studs of the bolster plate;
a TIM on a top surface of the electronic device, wherein the TIM is between a bottom surface of the heat sink and the top surface of the electronic device; and
a back plate on the bottom surface of the package substrate, wherein the back plate is coupled to the bolster plate.

18. The semiconductor package of claim 17, wherein the heat sink includes four fin cutouts and four fins, wherein each fin is disposed between two of the four fin cutouts.

19. The semiconductor package of claim 17, wherein the electronic device and the carrier are coupled onto the bolster plate without the heat sink.

20. The semiconductor package of claim 16, wherein the first alignment openings of the carrier and the second alignment openings of the bolster plate are coupled by screws.

21. The semiconductor package of claim 16, wherein the electronic device includes a semiconductor die, an IC, a CPU, a microprocessor, a PCH, a memory, and a FPGA.

22. The semiconductor package of claim 16, wherein the carrier has a thickness that is approximately equal to or less than a thickness of the electronic device.

23. A carrier assembly, comprising:
- a socket on a top surface of a package substrate, wherein the top surface is opposite to a bottom surface of the package substrate;
- a carrier having a transparent material, a first opening, first alignment openings, and barbs;
- an electronic device embedded into the first opening of the carrier, wherein the electronic device is coupled to the carrier by the barbs of the carrier; and
- a bolster plate on the top surface of the package substrate, the bolster plate having a second opening, loading studs, and second alignment openings, wherein each of the loading studs is positioned on a corner edge of the bolster plate, wherein the second opening of the bolster plate surrounds the socket on the package substrate, and wherein the first alignment openings of the carrier are aligned above the second alignment openings of the bolster plate to couple the carrier onto the bolster plate;
- a heat sink on the electronic device, the carrier, and the bolster plate, wherein the heat sink includes load nuts, fins, and fin cutouts, wherein each load nut is disposed in a fin cutout of the heat sink, wherein each fin cutout is located at a corner edge of the heat sink, and wherein the heat sink is coupled to the bolster plate by coupling the loads nuts of the heat sink onto the loading studs of the bolster plate;
- a thermal interface material (TIM) on a top surface of the electronic device, wherein the TIM is between a bottom surface of the heat sink and the top surface of the electronic device; and
- a back plate on the bottom surface of the package substrate, wherein the back plate is coupled to the bolster plate.

* * * * *